(12) United States Patent
Sakamoto et al.

(10) Patent No.: US 7,461,512 B2
(45) Date of Patent: Dec. 9, 2008

(54) SYSTEM AND METHOD FOR SUPPRESSING SUBLIMATION USING OPACIFIED AEROGEL

(75) Inventors: Jeff S. Sakamoto, San Gabriel, CA (US); G. Jeffrey Snyder, Altadena, CA (US); Thierry Calliat, Pasadena, CA (US); Jean-Pierre Fleurial, Altadena, CA (US); Steven M. Jones, LaCrescenta, CA (US); Jong-Ah Palk, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 400 days.

(21) Appl. No.: 10/977,276

(22) Filed: Oct. 29, 2004

(65) Prior Publication Data
US 2006/0090475 A1 May 4, 2006

Related U.S. Application Data

(60) Provisional application No. 60/515,259, filed on Oct. 29, 2003.

(51) Int. Cl.
*F25B 21/02* (2006.01)
(52) U.S. Cl. .................. 62/3.7; 252/62; 106/159.1; 106/135.1; 106/122; 340/584; 428/317.9; 264/45.3

(58) Field of Classification Search ............ 62/3.2, 62/3.7; 252/62; 264/45.3; 106/122, 135.1, 106/159.1; 428/317.9; 340/584
See application file for complete search history.

(56) References Cited

U.S. PATENT DOCUMENTS

| | | | | |
|---|---|---|---|---|
| 6,100,503 | A * | 8/2000 | Sasaki et al. | 219/411 |
| 6,136,216 | A * | 10/2000 | Fidler et al. | 252/62 |
| 6,150,643 | A * | 11/2000 | Kitamura et al. | 219/542 |
| 6,316,092 | B1 * | 11/2001 | Frank et al. | 428/312.6 |
| 6,492,014 | B1 * | 12/2002 | Rolison et al. | 428/317.9 |
| 6,509,520 | B1 | 1/2003 | Kyle et al. | |
| 2003/0003284 | A1 * | 1/2003 | Schwertfeger et al. | 428/292.1 |
| 2003/0112145 | A1 * | 6/2003 | Allen et al. | 340/584 |
| 2003/0176900 | A1 * | 9/2003 | MacDonald | 607/61 |

* cited by examiner

*Primary Examiner*—Cheryl J. Tyler
*Assistant Examiner*—Emily Iris Nalven
(74) *Attorney, Agent, or Firm*—Tope-McKay & Associates

(57) ABSTRACT

The present invention relates to a castable, aerogel-based, ultra-low thermal conductivity opacified insulation to suppress sublimation. More specifically, the present invention relates to an aerogel opacified with various opacifying or reflecting constituents to suppress sublimation and provide thermal insulation in thermoelectric modules. The opacifying constituent can be graded within the aerogel for increased sublimation suppression, and the density of the aerogel can similarly be graded to achieve optimal thermal insulation and sublimation suppression.

6 Claims, 7 Drawing Sheets

US 7,461,512 B2

SYSTEM AND METHOD FOR SUPPRESSING SUBLIMATION USING OPACIFIED AEROGEL

PRIORITY CLAIM

The present application claims the benefit of priority of U.S. Provisional Patent Application No. 60/515,259, filed Oct. 29, 2003, entitled "Castable, Aerogel-Based, Thermal Insulation."

STATEMENT OF GOVERNMENT INTEREST

This invention described herein was made in the performance of work under a NASA contract, and is subject to the provisions of Public Law 96-517 (35 USC 202) in which the Contractor has elected to retain title.

BACKGROUND OF THE INVENTION (1) Technical Field

The present invention relates to a castable, aerogel-based, ultra-low thermal conductivity opacified insulation for suppressing sublimation. More specifically, the present invention relates to an aerogel opacified with various opacifying or reflecting constituents to suppress sublimation and provide thermal insulation in thermoelectric modules.

(2) Background

Thermoelectric devices are attractive options for the generation of electricity and refrigeration because of their high reliable, silent, vibration-free operation; lack of compressed gases, chemicals, or other consumables; and complete scalability. Thermoelectric materials have been employed in space to power the Apollo, Viking, Pioneer and Voyager space missions, and are currently used in automotive seat cover coolers, in portable refrigerators that plug into an automobile's cigarette lighter, and in chemical and nuclear generators in artic regions and space probes.

Thermoelectric devices work by naturally generating a temperature gradient in the presence of an electromotive force (emf); conversely they produce an emf in a temperature gradient. While all materials except superconductors posses some thermoelectric character, only a few materials are efficient enough to generate interest. These include the lead, bismuth, and antimony chalcogenides, skutterudites (such as cobalt triantimonide), bismuth antimony, silicon germanium, boron carbides, and more complex compounds and alloys based on these materials.

One example of a thermoelectric device is a thermoelectric refrigerator. A thermoelectric refrigerator connects two or more pieces of thermoelectric material to a voltage source. One skilled in the art will appreciate that a generator can be made from the same device if the voltage source is replaced by a load (i.e., a battery charger). Nearly all thermoelectric devices use two different types of materials, one "n-type" and the other "p-type." These materials must be connected so that they are electrically in series, but thermally in parallel.

A specific example of a thermoelectric device is shown in FIG. 1 (Prior art). In this example, the thermoelectric generators/coolers 100 employ elements or legs 102 with high aspect ratios. To efficiently generate power or cool, the legs should be insulated with insulation 104 so that heat flows through the legs rather than being radiated laterally outward 106.

One drawback of the prior art is degradation of the thermoelectric material by sublimation. Sublimation is a degradation mechanism, which can rapidly diminish performance in thermoelectric power generation. It has been previously shown that sublimation of antimony (Sb) from advanced, skutterudite (SKD) thermoelectric materials (such as $CoSb_3$ and $CeFe_30.5Co0.5Sb_{12}$) degrades device performance. It has also been shown that the sublimation of Sb could be suppressed by the application of robust, micron scale coatings. These coatings consisted of thin metal foils of titanium or molybdenum. Although the films were thin enough to minimize thermal and electrical shorting, which can potentially diminish performance, coatings that are both electrically and thermally insulating are preferred.

Thus, what is needed is a system and method that allows for reduction in sublimation for thermoelectric devices to extend the life and durability of these devices.

Aerogel is a silicon-based solid with a porous, sponge-like structure in which 99.8 percent of the volume is empty space. In comparison to glass, also a silicon-based solid, aerogel is 1,000 times less dense. Additionally, aerogel has extreme microporosity on a micron sale. It is composed of individual features only a few nanometers in size. These are linked in a highly porous dendritic-like structure.

Aerogel has properties such as low thermal conductivity, low refractive index and low sound speed. Aerogel is made by high temperature and pressure-critical drying of a gel composed of colloidal silica structural units filled with solvents. Aerogel is available from Jet Propulsion Laboratory (Pasadena, Calif.).

SUMMARY OF THE INVENTION

The present invention provides a system and a method that overcomes the aforementioned limitations and fills the aforementioned needs by providing a castable, aerogel-based, ultra-low thermal conductivity opacified insulation to suppress sublimation.

The present invention relates to a castable, aerogel-based, ultra-low thermal conductivity opacified insulation to suppress sublimation. More specifically, the present invention relates to an aerogel opacified with various opacifying or reflecting constituents to suppress sublimation and provide thermal insulation in thermoelectric elements. The opacifying constituent can be graded within the aerogel for increased sublimation suppression, and the density of the aerogel can similarly be graded to achieve optimal thermal insulation and sublimation suppression.

In one aspect of the invention, a system for sublimation suppression comprises an opacified aerogel surrounding a portion of a thermoelectric element, whereby the aerogel suppresses sublimation.

In another aspect of the invention, the opacified aerogel is opacified with various opacifying or reflecting constituents.

In yet another aspect, the opacifying constituent is selected from a group consisting of ceramic powder, graphite powder, carbon black, aluminum oxide, titanium oxide, or reflective metal flake.

In still another aspect, the opacified aerogel has a concentration gradient of opacifying constituent such that a portion of the opacified aerogel has a higher concentration of opacifying constituent than another portion.

In a yet further aspect, the density of the opacified aerogel is higher on an upper portion of the aerogel and lower on a lower portion of the aerogel, such that the upper portion corresponds to a hot side of the thermoelectric element, and the lower portion corresponds to a cool side of the thermoelectric element.

In a further aspect of the present invention, a system for sublimation suppression comprises an opacified aerogel surrounding a portion of a thermoelectric module; the aerogel being opacified with an opacifying or reflecting constituent; the opacifying constituent selected from a group consisting of ceramic powder, graphite powder, carbon black, aluminum oxide, titanium oxide, or reflective metal flake; the opacified aerogel having a concentration gradient of opacifying constituent such that one portion of aerogel has a higher concentration of opacifying constituent than another portion; and the opacified aerogel having a higher density on an upper portion and a lower density on a lower portion, the upper portion corresponding to the hot side of a thermoelectric element, and the lower portion corresponding to the cool side of a thermoelectric element.

In another aspect of the present invention, a method for suppressing sublimation comprises acts of surrounding a portion of a thermoelectric element with an opacified aerogel.

In a further aspect, the method for suppressing sublimation further comprises an act of opacifying an aerogel with various opacifying or reflecting constituents.

In still another aspect, the method for suppressing sublimation further comprises an act of selecting an opacifying constituent from a group consisting of ceramic powder, graphite powder, carbon black, aluminum oxide, titanium oxide, or reflective metal flake.

In a yet further aspect, the method for suppressing sublimation further comprises an act of creating a concentration gradient of opacifying constituent within the opacified aerogel such that one portion of the opacified aerogel has a higher concentration of opacifying constituent than another portion.

In yet another aspect, the method for suppressing sublimation further comprises an act of creating an opacified aerogel such that an upper portion of the opacified aerogel has a high density and a lower portion of the opacified aerogel has a lower density, the upper portion corresponding to the hot side of a thermoelectric element, and the lower portion corresponding to the cool side of a thermoelectric element.

In a further aspect of the present invention, a method for suppressing sublimation comprises acts of surrounding a portion of a thermoelectric element with an opacified aerogel; opacifying an aerogel with various opacifying or reflecting constituents; selecting an opacifying constituent from a group consisting of ceramic powder, graphite powder, carbon black, aluminum oxide, titanium oxide, or reflective metal flake; creating a concentration gradient of opacifying constituent within the opacified aerogel such that one portion of the opacified aerogel has a higher concentration of opacifying constituent than another portion; and creating an opacified aerogel such that an upper portion of the opacified aerogel has a high density and a lower portion of the opacified aerogel has a lower density, the upper portion corresponding to the hot side of a thermoelectric element, and the lower portion corresponding to the cool side of a thermoelectric element.

BRIEF DESCRIPTION OF THE DRAWINGS

The objects, features and advantages of the present invention will be apparent from the following detailed descriptions of the disclosed aspects of the invention in conjunction with reference to the following drawings, where.

Figure 1:
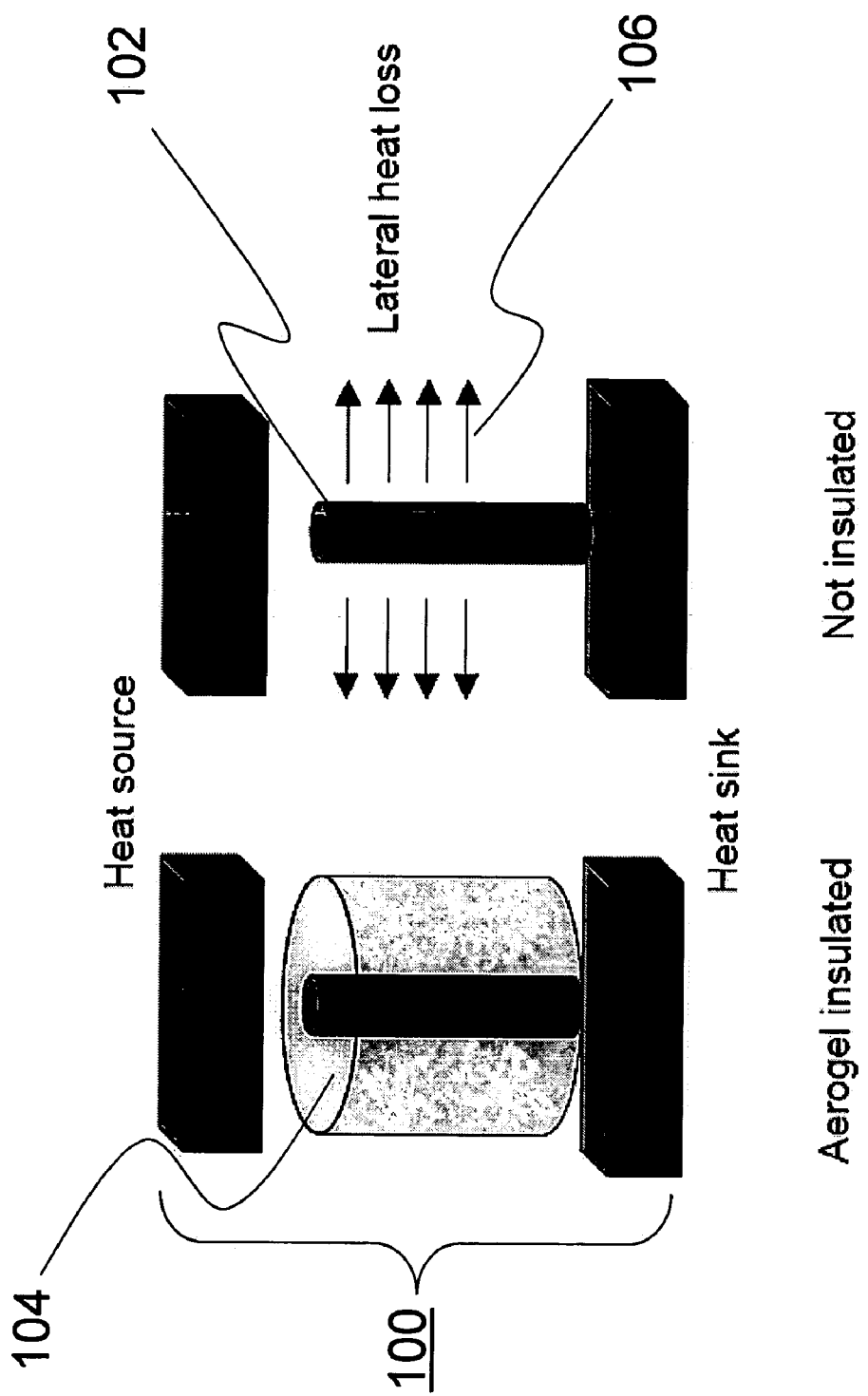
FIG. 1 is a prior art representation of a castable aerogel-based insulation placed around a thermoelectric device.

Cross-thatching patterns in the above-referenced drawings are not intended to denote coloration, but rather to distinguish drawing regions.

DETAILED DESCRIPTION

The present invention relates to a castable aerogel-based opacified material. More specifically, the present invention relates to an aerogel opacified with an opacifying material to suppress sublimation. The following description, taken in conjunction with the referenced drawings, is presented to enable one of ordinary skill in the art to make and use the invention and to incorporate it in the context of particular applications. Various modifications, as well as a variety of uses in different applications, will be readily apparent to those skilled in the art, and the general principles, defined herein, may be applied to a wide range of embodiments. Thus, the present invention is not intended to be limited to the embodiments presented, but is to be accorded the widest scope consistent with the principles and novel features disclosed herein. Furthermore, it should be noted that unless explicitly stated otherwise, the figures included herein are illustrated diagrammatically and without any specific scale, as they are provided as qualitative illustrations of the concept of the present invention.

(1) Introduction

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents that are filed concurrently with this specification and are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

The description outlined below sets forth a castable, opacified, aerogel-based material. More specifically, the description sets forth a system and method for opacifying aerogel with an opacifying material to suppress sublimation.

(2) Advantages of Opacified Aerogel

Aerogel has the distinct advantage of an extremely low-density (3 milligrams/cubic centimeter (mg/cc)) which adds negligible mass to any given system. Additionally, its ability to be cast in liquid solution and later solidified makes it ideal for applying in small spaces not otherwise reachable with solid insulators. Finally, and perhaps most importantly, the aerogel solution can be combined with other materials to achieve different properties.

Figure 2:
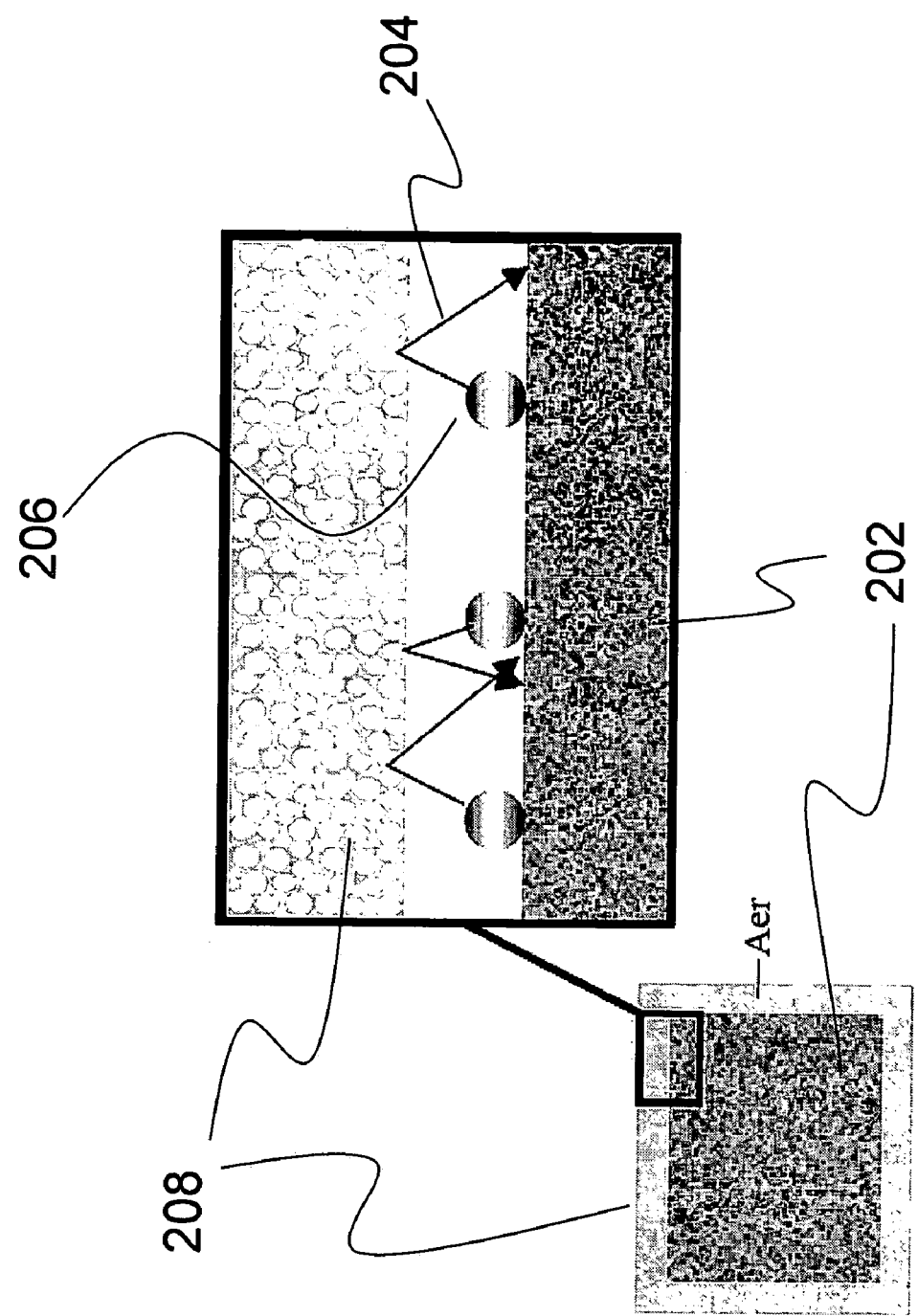
FIG. 2 is an illustration, depicting a cross-section view of a $CoSb_3$ disk coated with aerogel according to the present invention, depicting reflection of antimony (Sb) vapor molecules off the aerogel in the act of suppressing sublimation.

By surrounding typical thermoelectric components with a continuous aerogel barrier, the vapor transport of the thermoelectric component material is significantly impeded. As depicted in FIG. 2, in experiments using $CoSb_3$ 202, the mean free path 204 of Sb vapor 206 under predicted operating conditions of 700 degrees Celsius and $10^{-6}$ torr is on the order of centimeters or longer. However, the mean free path 204 of Sb 206 is far greater than the pore diameter of aerogel 208, thus severely hindering, if not stopping altogether, the Sb vapor 206 transport. The presence of aerogel 208 near the surface of $CoSb_3$ 202 thus establishes a highly-localized equilibrium environment at the surface of the $CoSb_3$ 202.

Figure 3:
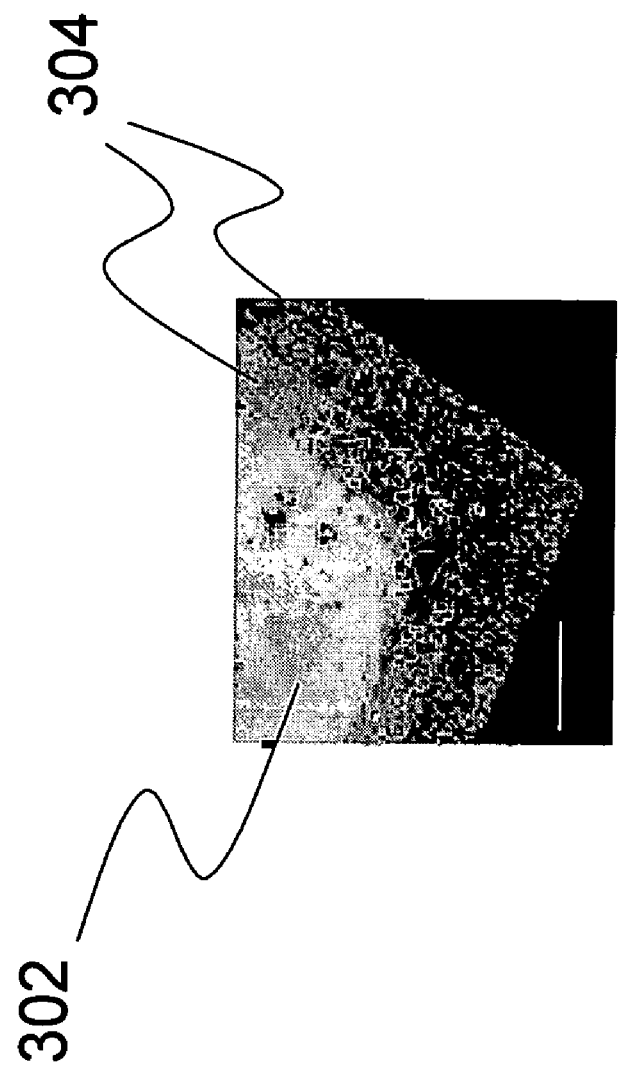
FIG. 3 is a photograph of a magnified, uncoated $CoSb_3$ disk, illustrating the layers of depletion of $CoSb_3$ resulting from sublimation of the uncoated $CoSb_3$ disk.

FIG. 3 illustrates the expected sublimation of $CoSb_3$ 302 without the presence of aerogel, particularly the sublimed layers 304 on the surface of the $CoSb_3$; a sharp contrast with the intact layers 302 not yet affected by sublimation.

The addition of opacifiers to aerogel for use in high-temperature environments yields additional reduction in sublimation beyond the previously known properties of aerogel. In one aspect, opacifiers such as carbon black, aluminum oxide, and titanium dioxide have all demonstrated similar sublimation suppression properties in aerogel. One skilled in the art will appreciate that additional micron-sized opacifiers, such as reflective metal flake, will yield similar results. Particles of titanium or aluminum metal flake are examples of reflective metal flakes.

In one embodiment of the present invention, the selected opacifier can be graded within the aerogel mixture, providing a higher concentration of opacified material on the upper or lower sections of the aerogel to achieve desired sublimation suppression.

Figure 4:
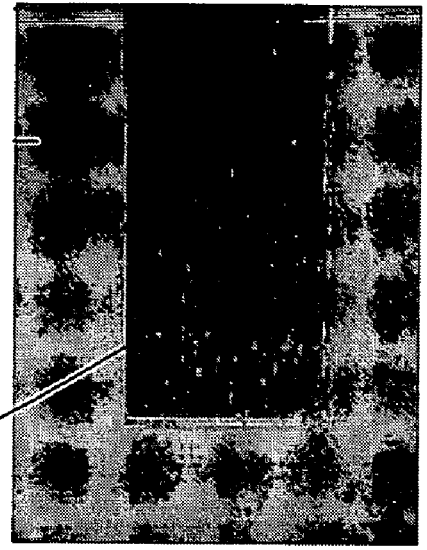
FIG. 4 is a photograph of a magnified, previously coated $CoSb_3$ disk, illustrating the lack of significant depletion after 48 hours at 700 degrees Celsius (C.)

FIG. 4 shows a $CoSb_3$ disk 400 surrounded by an aerogel over a period of 48 hours at 700 degrees Celsius (C.). Unlike the exposed $CoSb_3$ disk in FIG. 3, the disk 400 surrounded by aerogel shows no signs of sublimation.

Figure 5:
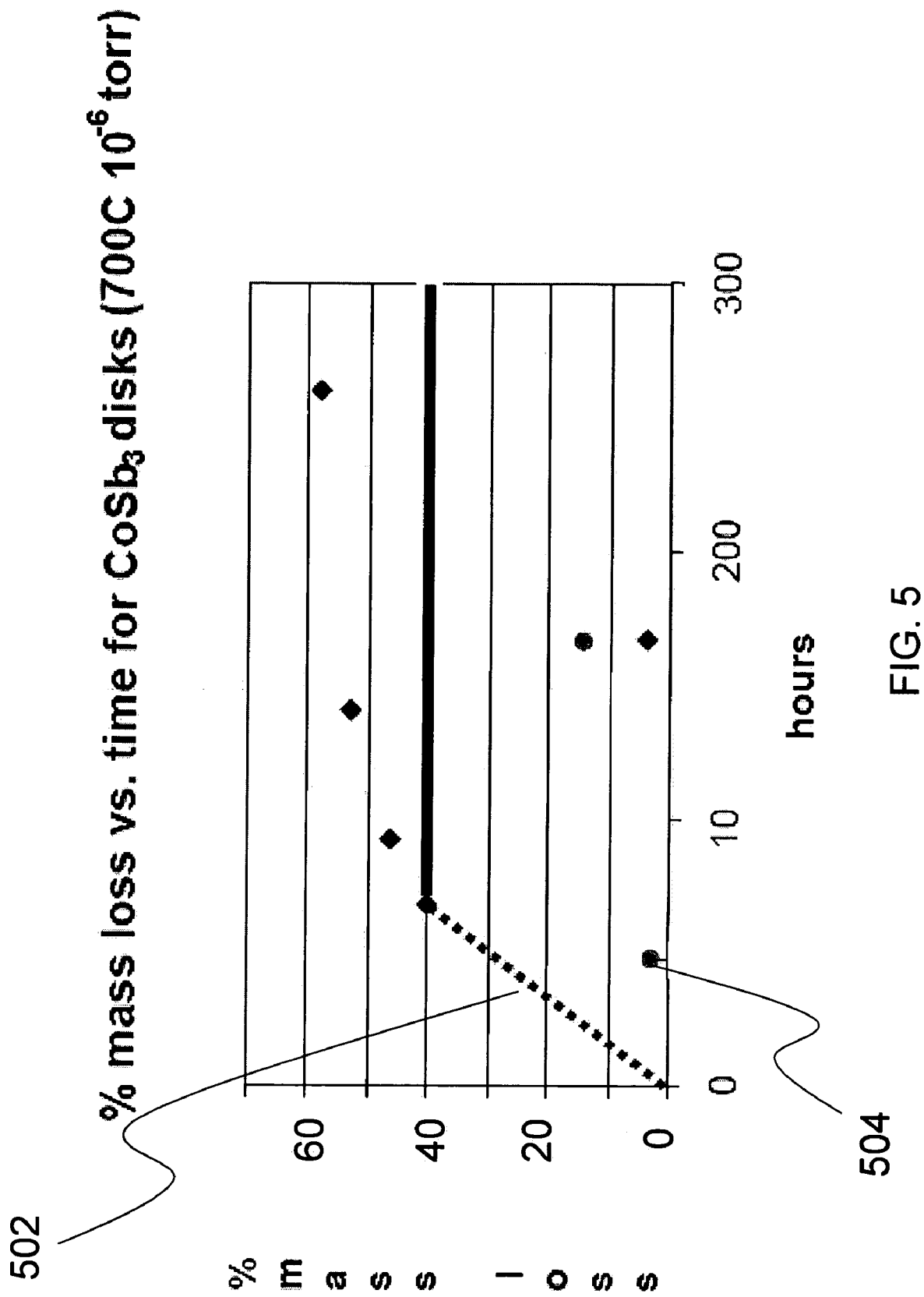
FIG. 5 is a chart comparing the sublimation rate of $CoSb_3$ samples to $CoSb_3$ samples coated with aerogel.

The chart in FIG. 5 further illustrates the distinct advantage of aerogel in suppressing sublimation. The estimated sublimation rate of a $CoSb_3$ disk is shown by the line 502, while the amount of sublimation for an aerogel-coated disk is represented by the dot 504. After subjecting $CoSb_3$ disks to 700 C for 29 hours, the aerogel-coated sample lost only 2.6 percent of its weight. In comparison to the estimated sublimation rate from previous experiments, the aerogel coating slowed the mass-loss rate by at least a factor of 10.

An additional benefit of the opacified aerogel is that no mass is added to a system by the addition of a selected opacifier. Thus, this insulation material is beneficial in applications where the weight of the thermoelectric components is critical to success, such as in deep space applications. Along with the thermoinsulating properties of opacified aerogel, the unique ability of the aerogel to suppress sublimation will tremendously enhance both the efficiency and longevity of thermoelectric devices.

Figure 6:
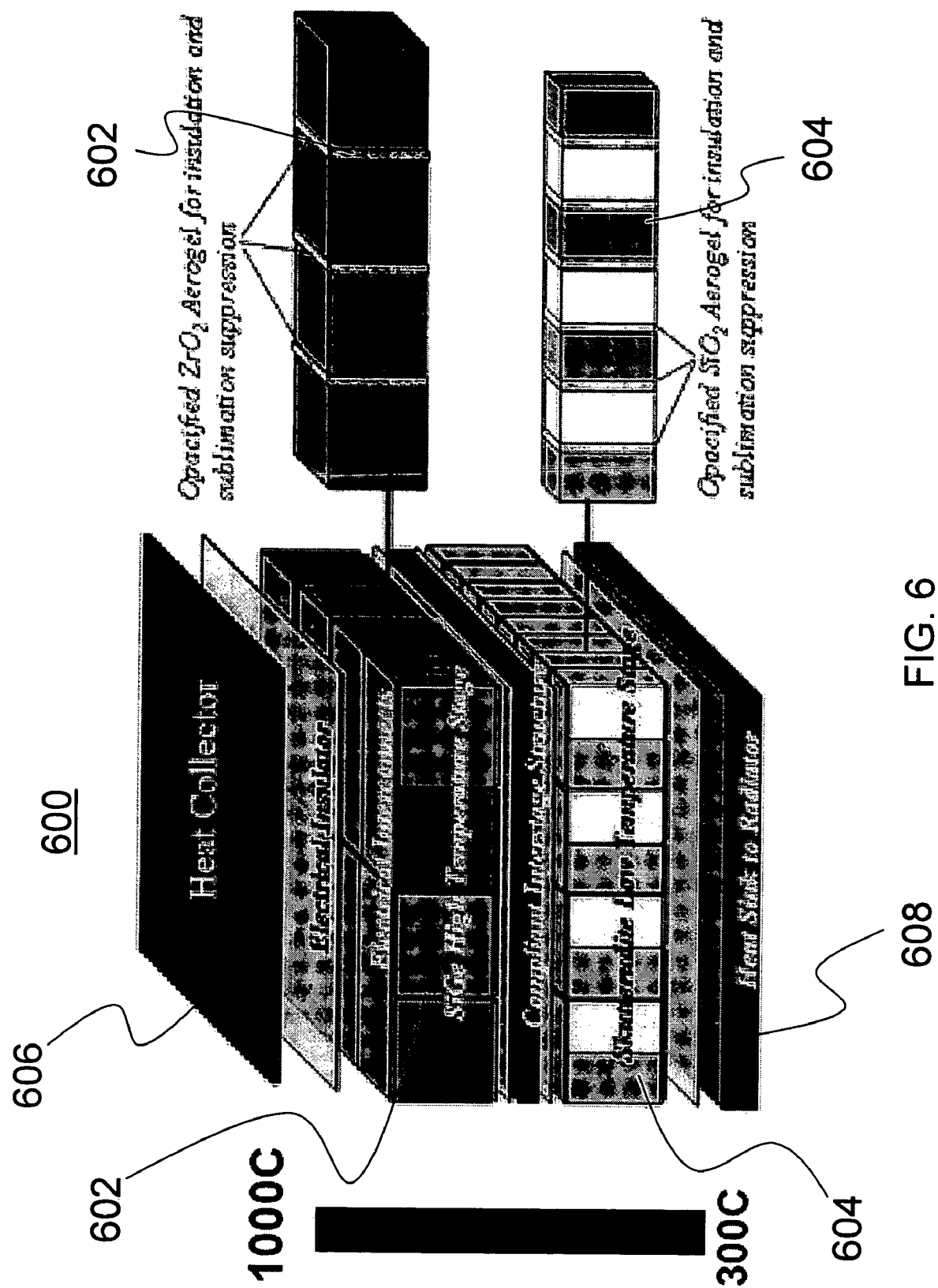
FIG. 6 is an illustration, depicting a thermoelectric module according to the present invention, with an interpenetrating network on opacified aerogel for suppressing sublimation and thermoelectric insulation.

FIG. 6 depicts one embodiment of the application of an opacified aerogel in a thermoelectric module 600. The aerogel 602 forms an interpenetrating network surrounding each individual thermoelectric leg 604. In this configuration, aerogel 602 will simultaneously suppress sublimation and thermally insulate each leg 604 while adding practically no mass to the module 600.

In one embodiment of the present invention, the density of opacified aerogel may be varied depending on the particular application. Higher density aerogel (greater than 100 mg/cc) has been shown to suppress sublimation better than lower density aerogel (50 mg/cc). However, the increase in density also increases thermal conductivity, which is disadvantageous in certain situations. One solution to this problem is to use a gradient density aerogel, which provides optimized sublimation suppression only where needed; specifically, on the hot end 606 of the device. The cool end 608 of the device contains a lower density aerogel as compared to the higher density aerogel on the hot end 606.

Due to shrinkage of the aerogel substance over time, varying concentrations of opacified material may be added to reduce shrinkage of the material and prevent cracking of the opacified aerogel. Cracking of the aerogel decreases the sublimation suppression and should be avoided.

(3) Forming the Opacified Aerogel

In one embodiment, the process for forming the aerogel is a two-step sol-gel process (sol being a colloidal solution dispersed particulate matter in a continuous medium). The first step involves combining and refluxing requisite amounts of tetrahylorthosilicate, ethanol, water and nitric acid. Ethanol is distilled from the mixture. Once the distillation is complete, tetraethylorthosilicate is added. The mixture is refluxed and then additional ethanol is distilled from the system. The final mixture is diluted with acetonitrile, thus forming the stock sol. To form a wet gel, sol, water, ammonia hydroxide base, and acetonitrile are then combined. To opacify the final gel, the opacifier is also added at this point. By varying the amount of sol versus solvent used, the density of the final gel can be dictated. This solution of "sol" is then poured into the appropriate molds containing $CoSb_3$ samples and allowed to solidify or "gel." After gelation (or solidification), the samples are transferred into a critical point dryer pre-filled with acetonitrile. The apparatus is sealed, heated to 295C, and pressurized to 5.5 megaPascal (MPa). In this embodiment, these conditions provide the established supercritical conditions for acetonitrile.

In another embodiment, the opacified aerogel is graded by gradually diluting the sol, solvent, water and base with solvent as the mixture is being pumped into the mold. As the opacifier is added, the particles naturally tend to sediment due to gravity, and this establishes dynamic gradients within the solution. The gellation rate is timed such that the opacifying constituents are "frozen" in place in various states of sedimentation, thus establishing a graded aerogel.

The conditions required to achieve supercritical conditions with acetonitrile may be incompatible with microelectronic devices. Thus, in an additional embodiment, solvents such as carbon dioxide ($CO_2$) could also be considered. Supercritical conditions with $CO_2$ can be achieved at 45 degrees Celsius (C.), making it compatible with most microelectronic devices and even biological samples.

Figure 7:
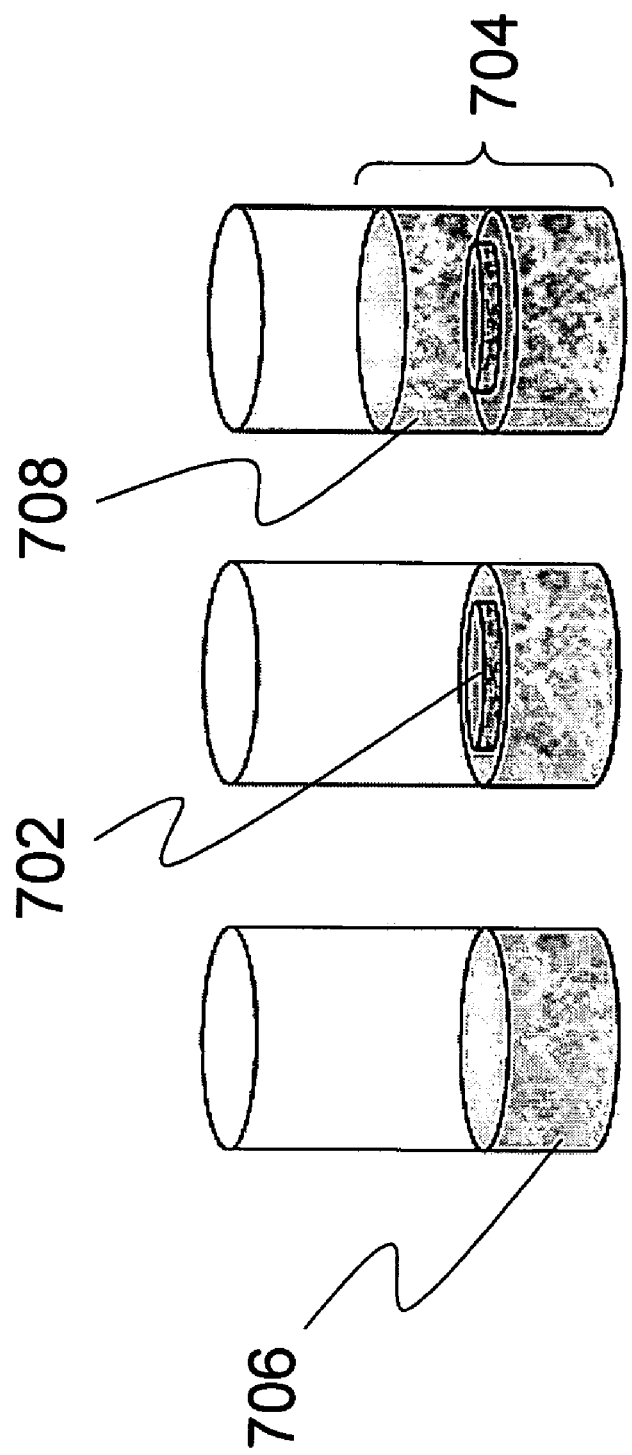
FIG. 7 is an illustration of the steps of encapsulating a sample with aerogel according to the present invention, showing the results of the acts of encapsulating a $CoSb_3$ sample by casting a predetermined volume of liquid aerogel solution, forming a gel with this solution, placing a $CoSb_3$ disk upon the aerogel layer, and casting another predetermined volume of liquid aerogel solution on the $CoSb_3$ disk, where the second layer is then allowed to gel, forming a completely encapsulated $CoSb_3$ disk.

In a further embodiment, the CoSb$_3$ samples are prepared using a standard powder metallurgical process. As illustrated in FIG. 7, these CoSb$_3$ sample disks 702 are suspended or encapsulated in aerogel 704 by first casting a 7 millimeter (mm) thick layer of liquid sol 706 into a mold. This layer 706 is allowed to solidify or gel, after which the CoSb$_3$ disk 702 is placed on top. Another layer of sol 708 is cast on top of the CoSb$_3$ disk 702 and allowed to gel. At this point, the entire gel 704 is transferred into the pre-filled critical point dryer and super-critically dried as described above.

What is claimed is:

1. A system for sublimation suppression comprising:
   an opacified aerogel surrounding a portion of a thermoelectric element, whereby the aerogel suppresses sublimation;
   wherein the opacified aerogel is opacified with various opacifying or reflecting constituents; and
   wherein the opacified aerogel has a concentration gradient of opacifying constituent such that a portion of the opacified aerogel has a higher concentration of opacifying constituent than another portion.

2. A system for sublimation suppression comprising:
   an opacified aerogel surrounding a portion of a thermoelectric element, whereby the aerogel suppresses sublimation;
   wherein the opacified aerogel is opacified with various opacifying or reflecting constituents; and
   wherein the density of the opacified aerogel is higher on an upper portion of the aerogel and lower on a lower portion of the aerogel, such that the upper portion corresponds to a hot side of the thermoelectric element, and the lower portion corresponds to a cool side of the thermoelectric element.

3. A system for sublimation suppression comprising:
   an opacified aerogel surrounding a portion of a thermoelectric module;
   the aerogel being opacified with an opacifying or reflecting constituent;
   the opacifying constituent selected from a group consisting of ceramic powder, graphite powder, carbon black, aluminum oxide, titanium oxide, and reflective metal flake;
   the opacified aerogel having a concentration gradient of opacifying constituent such that one portion of aerogel has a higher concentration of opacifying constituent than another portion; and
   the opacified aerogel having a higher density on an upper portion and a lower density on a lower portion, the upper portion corresponding to the hot side of a thermoelectric element, and the lower portion corresponding to the cool side of a thermoelectric element.

4. A method for suppressing sublimation comprising acts of:
   surrounding a portion of a thermoelectric element with an opacified aerogel;
   opacifying an aerogel with various opacifying or reflecting constituents; and
   creating a concentration gradient of opacifying constituent within the opacified aerogel such that one portion of the opacified aerogel has a higher concentration of opacifying constituent than another portion.

5. A method for suppressing sublimation comprising acts of:
   surrounding a portion of a thermoelectric element with an opacified aerogel;
   opacifying an aerogel with various opacifying or reflecting constituents; and
   creating an opacified aerogel such that an upper portion of the opacified aerogel has a high density and a lower portion of the opacified aerogel has a lower density, the upper portion corresponding to the hot side of a thermoelectric element, and the lower portion corresponding to the cool side of a thermoelectric element.

6. A method for suppressing sublimation comprising acts of
   surrounding a portion of a thermoelectric element with an opacified aerogel;
   opacifying an aerogel with various opacifying or reflecting constituents;
   selecting an opacifying constituent from a group consisting of ceramic powder, graphite powder, carbon black, aluminum oxide, titanium oxide, and reflective metal flake;
   creating a concentration gradient of opacifying constituent within the opacified aerogel such that one portion of the opacified aerogel has a higher concentration of opacifying constituent than another portion; and
   creating an opacified aerogel such that an upper portion of the opacified aerogel has a high density and a lower portion of the opacified aerogel has a lower density, the upper portion corresponding to the hot side of a thermoelectric element, and the lower portion corresponding to the cool side of a thermoelectric element.

* * * * *